United States Patent [19]

Ishitani

[11] Patent Number: 4,632,522
[45] Date of Patent: Dec. 30, 1986

[54] OPTICAL SYSTEM OF VARIABLE MAGNIFICATION AND A METHOD FOR VARYING MAGNIFICATION OF THE SAME

[75] Inventor: Yusuke Ishitani, Osaka, Japan

[73] Assignee: Mita Industrial Co., Ltd., Osaka, Japan

[21] Appl. No.: 665,357

[22] Filed: Oct. 26, 1984

[30] Foreign Application Priority Data

Oct. 31, 1983 [JP] Japan .............................. 58-205686
Oct. 31, 1983 [JP] Japan .............................. 58-205687

[51] Int. Cl.$^4$ .......................... G02B 7/02; G03B 27/52
[52] U.S. Cl. ........................................ 350/570; 355/55
[58] Field of Search .................... 355/46, 55; 350/167, 350/570

[56] References Cited

U.S. PATENT DOCUMENTS 3,580,675  5/1971  Hieber et al. ..................... 350/167
4,050,811  9/1977  Russell ............................. 355/46
4,368,975  1/1983  Matsui et al. ..................... 355/46
4,394,083  7/1983  Rees .
4,512,641  4/1985  Mochizuki et al. ................ 350/167

Primary Examiner—Bruce Y. Arnold
Attorney, Agent, or Firm—Spencer & Frank

[57] ABSTRACT

An optical system of variable magnification comprising one or more multilens units, each of which has a plurality of multilens-arrays positioned at certain spaces in the vertical direction, said multilens units being disposed in such a manner that the optical unit plane, containing optical axes of the lenses in each of the multilens arrays in one multilens unit, intersects other optical unit planes at the center line of said optical system and that each of the optical axes of the lenses in the multilens-array of each of the multilens units gradually deviates one after another from each of those of the corresponding lenses in the next positioned multilens-array within the optical unit plane.

Magnifications of the optical system are changed by rotating said optical system around the axis of the intersection line of the optical unit planes to a predetermined position.

10 Claims, 7 Drawing Figures

OPTICAL SYSTEM OF VARIABLE MAGNIFICATION AND A METHOD FOR VARYING MAGNIFICATION OF THE SAME

BACKGROUND OF THE INVENTION

1. Field of the invention

The invention relates to an optical system of variable magnification having multilens-array units and a method for varying magnification of the same.

2. Description of the prior art

In order to make compact photocopy machines, it has been proposed to apply multilens-arrays as an optical system to photocopy machines, instead of conventional spherical lenses having large apertures. Examples of these arrays are a convergent light-transmitter such as a Selfoc lens (trade name, Nippon Ita Glass Co., Japan), a microlens and a DAHA prism lens, all of which are composed of superposed lenses. Such optical systems do not provide a function of variable magnification, forming only an image in the same size as an object. Although such optical systems will be theoretically capable of enlarging or reducing an original with the desired overall magnification by two scanning processes, one of which allows an enlargement or reduction of the original in the main scanning direction and the other of which allows an enlargement or reduction thereof in the remaining sub-scanning direction, they require the two copying processes, which result in a complex copying system.

An alternative lens system is a zoom-type lens which, while providing variable magnification, is necessarily long, requiring a large housing and an increased size of the copy machine as a whole.

SUMMARY OF THE INVENTION

The optical system of this invention which overcomes the above-discussed disadvantage and numerous other drawbacks and deficiencies of the prior art, comprises one or more multilens units, each of which has a plurality of multilens-arrays positioned at certain spaces in the vertical direction, said multilens units being disposed in such a manner that the optical unit plane, containing optical axes of the lenses in each of the multilens arrays in one multilens unit, intersects other optical unit planes at the center line of said optical system and that each of the optical axes of the lenses in the multilens-array of each of the multilens units gradually deviates one after another from each of those of the corresponding lenses in the next positioned multilens-array within the optical unit plane, providing for variable magnification of the original.

A diaphragm limiting the field of view having a given field angle is, in a preferred embodiment, placed close to the front of each lens of the multilens-array positioned at at least the end of each of the multilens units so as to regulate the quantity of rays of light incident upon said lens, thereby preventing the resulting intermediate image from overlapping with the adjacent intermediate images formed by the adjacent lenses thereto.

The distance between the object and the multilens-array at the end of each of the multilens units is, in a preferred embodiment, equal to that between the final image and the multilens-array at the other end of each of the multilens units.

The method for varying magnifications of the optical system of this invention which overcomes the above-discussed disadvantage and numerous other drawbacks and deficiencies of the prior art, includes rotating said optical system around the axis of the intersectionn line of the optical unit planes to a predetermined position without varying the distance between the lens system and the original, thereby providing for a system which is smaller than conventional multilens-array systems.

Thus, the invention described herein makes possible the objects of (1) providing an optical system of variable magnification; (2) providing an optical system which has multilens-array units of a variety of variable magnifications; (3) providing an optical system which is capable of enlarging or reducing an original manuscript with excellent resolution within a small space by a single scanning process, resulting in a quicker copying process and resulting in a potentially smaller-sized photocopy machines utilizing this optical system therein; (4) providing a method for varying magnifications of the above-mentioned optical system.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
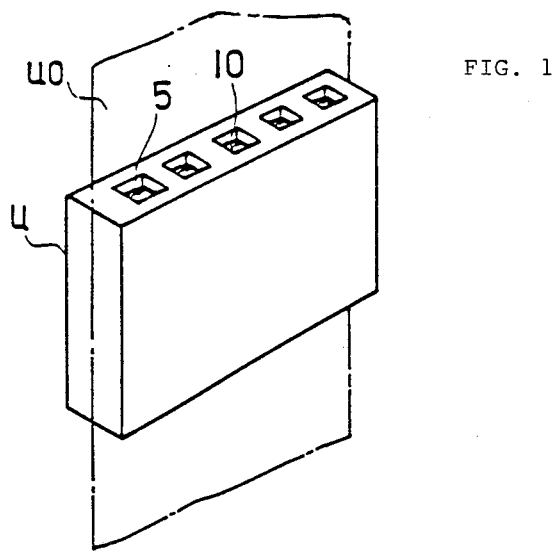
FIGS. 1 to 3 are a perspective view, a disassembled perspective view, and a partly sectional front view of an optical system of this invention.
Figure 2:
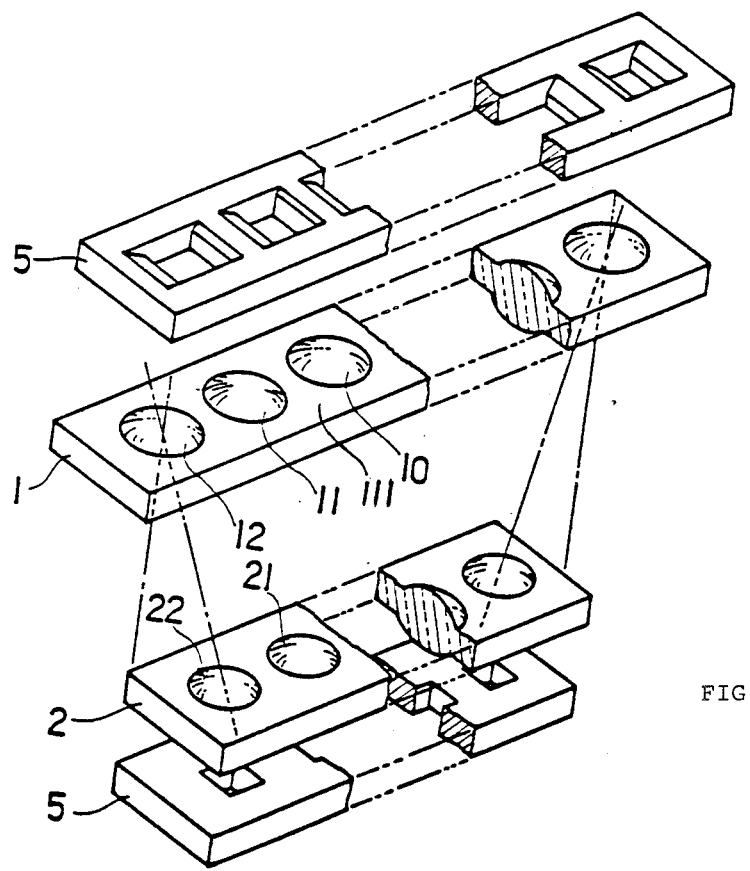
Figure 3:
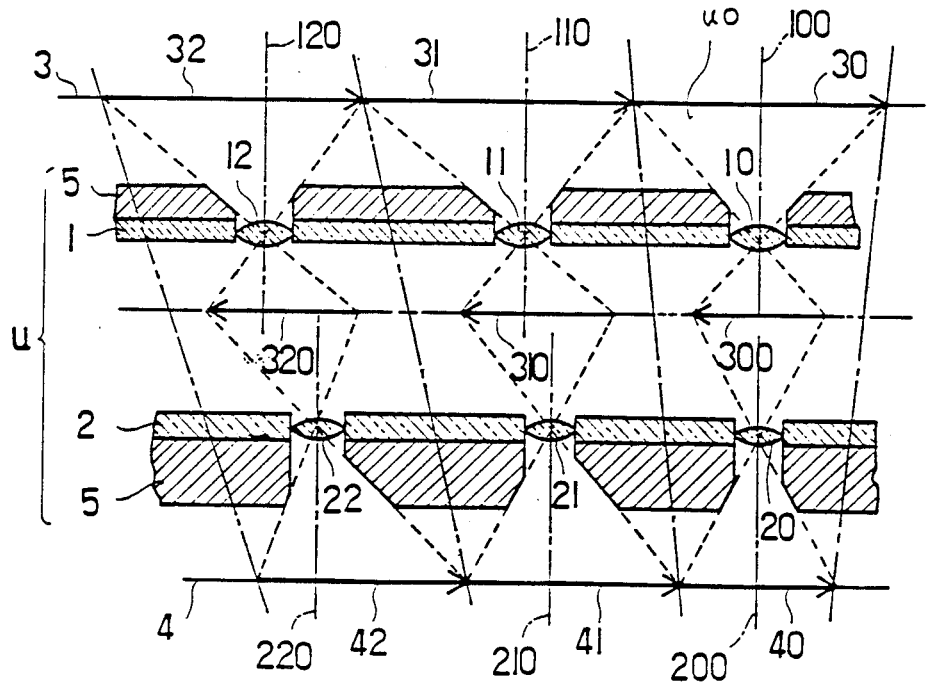

FIGS. 1 to 3 show an optical system according to this invention which comprises a multilens unit u having a plurality of multilens-arrays, for example, two multilens-arrays (i.e., a first multilens-array 1 and a second multilens-array 2) which are positioned at a certain space in the vertical direction. The first multilens-array 1 is composed of a plurality of lenses 10, 11, 12, ... arrayed in one plane, and the second multilens-array 2 is, likewise, composed of a plurality of lenses 20, 21, 22, ... arrayed in another plane. Each of the arrays can be made of plastic and the lens 10, 11, 12, ... can be simultaneously molded with their casing 111.

Each of the optical axes 100, 110, 120, ... 200, 210, 220, ... of the lens 10, 11, 12, ..., 20, 21, 22, ... is on the optical unit plane u0 of the multilens unit u. Each of the optical axes of the lenses of the multilens-array gradually deviates one after another from each of those of the corresponding lenses of another multilens-array within the optical unit plane u0 as it is positioned at a further distance from the optical axis 100 or 200 of lense 10 or 20 at the center of multilens-arrays 1 and 2. Such a deviation becomes greater as the optical axes are positioned at a further distance from the optical axes 100 and 200 of the lenses 10 and 20 which are at the center of the multilens-arrays 1 and 2. The deviation can be determined depending upon the focal length, the image distance (i.e., the distance between the object plane 3 and the screen 4) and the overall magnification.

Figure 4:
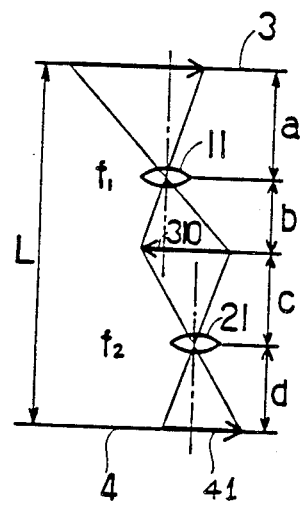
FIG. 4 is an illustration of the position of each corresponding lens in an optical system of this invention.

The design and the position of the multilens unit u are determined by the following formulas:

$$M = m_1 \cdot m_2 \quad (1)$$

$$M = \frac{(d - f_2)f_1}{(a - f_1)f_2} \quad (2)$$

$$L = \frac{a^2}{a - f_1} + \frac{d^2}{d - f_2} \quad (3)$$

wherein $m_1$ and $m_2$ are the magnifications of the first multilens-array 1 and the second multilens-array 2, respectively; $f_1$ and $f_2$ are the focal lengths of the lenses 11 and 21, respectively; L is the final image distance of this optical system; a is the object distance of the lens 11; b is the intermediate image distance of the lens 11, c is the object distance of the lens 21, d is the real image distance of the lens 21; M is the overall magnification of this optical system. (See FIG. 4.)

Given that the parameters $f_1$, $f_2$, L and M are known, the remaining parameters a and d can be calculated from the above-mentioned formulas (2) and (3), thereby determing the disposition of the first and the second lens-arrays 1 and 2, namely, the disposition of the unit u between the object face 3 and the screen 4.

In order to form a magnified final image on the screen 4 using this optical system, each portion of the object must coincide with each image formed by the corresponding lenses, and thus the field angle toward the object with respect to at least the first multilens-array 1 must be defined by the installation of a field of view diaphragm 5 at each of the lenses of the array 1. It is, of course, essential that each of the intermediate images obtained by the lenses of the array 1 never overlaps each other, and the first and the second lens-arrays 1 and 2 must be located to satisfy the following requirements:

$$\frac{d^2}{d - f_2} \geqq \frac{f_1 L}{a - f_2} \quad (4)$$

The object 3 is, for example, an original manuscript on an original glass plate made of a platen glass, etc., and the screen 4 is, for example, the surface of a photoconductor drum on which a final image is formed by this optical system.

The original glass plate can move relatively with regard to the surface of the photoconductor at a right angle to the optical unit plane u0 by a driving means.

Each portion of the manuscript 3 is scanned with the multilens unit u, forming the final image on the screen 4. Each of the lenses (e.g., lens 11) of the first lens-array 1 serves as an objective to form an intermediate image 310 on its convergent position, and each of the lenses (e.g., lens 21) of the second lens-array 2 serves as an objective with regard to the intermediate image 310 to form the final image 41 on the screen 4. In the same manner as mentioned above, the final image 42 is formed on the screen 4 through the formation of an intermediate image 320 by means of the lenses 12 and 22. The final image 40 corresponding to the portion 30 of the manuscript 3 is formed on the screen 4 through the formation of an intermediate image 300 by means of the lenses 10 and 20. Thus, the overall image coinciding with the manuscript 3 can be obtained, having a given magnification, on the screen 4. When the multilens unit u is turned upside down, the final image can be obtained in the same manner as the above-mentioned and its magnification will be the reciprocal of the original image provided that the afore-mentioned parameter a is equal to the parameter d. It should be understood that the rotation axis of the unit u is at the center between the arrays 1 and 2 and the center between the manuscript 3 and the screen 4.

In order to effectively conduct the scanning of the manuscript 3 with the unit u, it is preferred that a multilens-array crowded with lenses is prepared in such a manner that lenses are positioned in a zigzag pattern comprising at least two rows.

When two lens-arrays are used for an optical system as mentioned above, the beam of light incident upon a portion, which is far from the optical axis of each of the lenses in the array, cannot be effectively converged on the screen, and the intensity of illumination of the resulting final image is low in its peripheral region. In order to reduce this weakness, it is preferred to place a field lens-array in a position at an intermediate position so as to conjugate the two lens-arrays.

Figure 5:
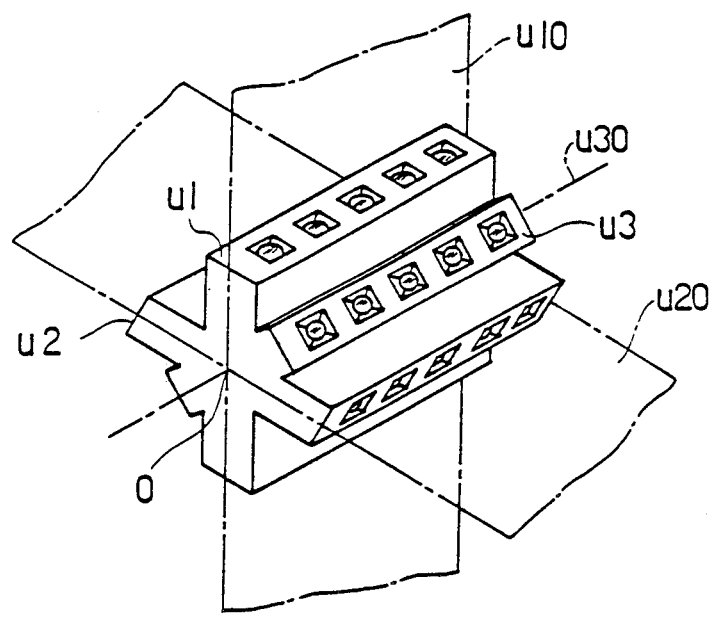
FIG. 5 is a perspective view of another optical system of this invention.
Figure 6:
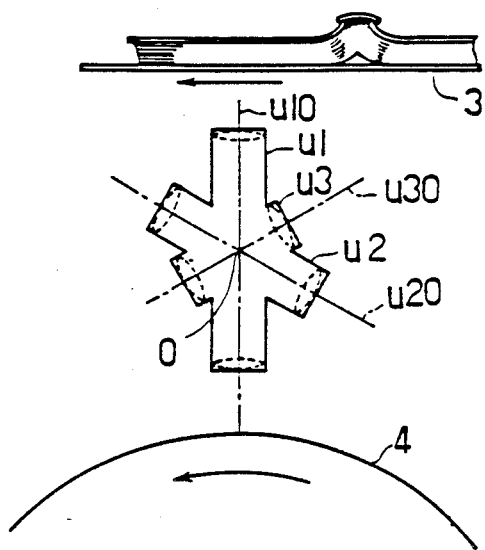
FIG. 6 is an illustration of the use of the optical system shown in FIG. 5.
Figure 7:
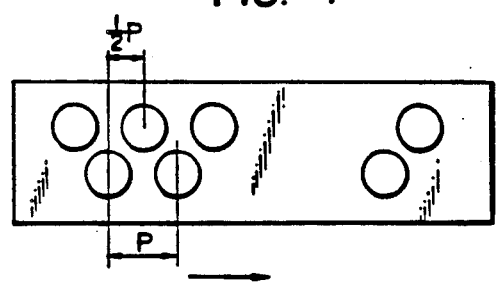
FIG. 7 is an illustration of a multilens unit with two rows of lenses positioned in a zig-zag pattern.

FIG. 5 shows another optical system of this invention which comprises a plurality of multilens units u1, u2 and u3, which are disposed in such a manner that their optical unit planes u10, u20 and u30 intersect each other at the center line 0 of this optical system. Each of the units u1, u2 and u3 can be constructed in the same manner as the unit u shown in FIGS. 1 to 4 in the afore-mentioned Example. As shown in FIG. 6, this optical system can be rotated around the center line 0 to adjust the desired unit u1, u2 or u3 to the manuscript 3, thereby forming a final image having the desired overall magnification on the screen (i.e., a photoconductor drum) 4. When any one of the units u1, u2 and u3 is turned upside down around the center line 0, the overall magnification of the resulting final image will be the reciprocal of the original image provided that the distance between the manuscript 3 and the unit lenses is equal to the distance between the unit lenses and the screen 4.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. An optical system of variable magnification comprising at least one multilens unit having a plurality of arrays of lenses positioned in spaced vertical relationship, each of said arrays of lenses having a plurality of identical lenses arranged in one or more rows, each row comprising an optical unit plane which contains coplanar optical axes of the lenses in each row of said arrays of lenses in said multilens unit, and each of the optical axes of the lenses in a row of lenses is non-colinear with each of the corresponding lenses in the next positioned row of lenses within an optical unit plane said optical system adapted to rotate around the axis of the center line of an optical unit plane to a predetermined position.

2. An optical system according to claim 1, wherein a diaphragm limiting the field of view having a given field angle is placed on each lens of the multilens-array positioned at at least the end of the multilens unit so as to regulate the quantity of rays of light incident upon said lens, thereby preventing the resulting intermediate image from overlapping with the adjacent intermediate images formed by the adjacent lenses thereof.

3. A method for varying magnifications of an optical system comprising at least one multilens unit having a plurality of arrays of lenses positioned in spaced vertical relationship, each of said arrays of lenses having a plurality of identical lenses arranged in one or more rows, each row comprising an optical unit plane which contains coplanar optical axes of the lenses in each row of said arrays of lenses in said multilens unit, and each of the optical axes of the lenses in a row of lenses is non-colinear with each of the corresponding lenses in the next positioned row of lenses within an optical unit plane, said method comprising rotating said optical system around the axis of the center line of an optical unit plane to a predetermined position.

4. A method according to claim 3, wherein a diaphragm limiting the field of view having a given field angle is placed on each lens of the multilens-array positioned at at least the end of the multilens unit so as to regulate the quantity of rays of light incident upon said lens, thereby preventing the resulting intermediate image from overlapping with the adjacent intermediate images formed by the adjacent lenses thereto.

5. A method according to claim 3 or 4, wherein the distance between an object and the multilens-array at the end of the multilens unit is equal to that between the final image and the multilens-array at the other end of the multilens unit.

6. An optical system of variable magnification comprising multilens units of a variety of variable magnifications, each of which has a plurality of arrays of lenses positioned in spaced vertical relationship, said multilens units being disposed in such a manner that an optical unit plane containing optical axes of the lenses in each of the arrays of lenses in one multilens unit intersects other optical unit planes at the center line of each of the optical unit planes, and each of said arrays of lenses having a plurality of identical lenses arranged in one or more rows, each row comprising an optical unit plane which contains coplanar optical axes of the lenses in each row of said arrays of lenses in a multilens unit, and each of the optical axes of the lenses in a row of lenses is non-colinear with each of the corresponding lenses in the next positioned row of lenses within an optical unit plane.

7. An optical system according to claim 6, wherein a diaphragm limiting the field of view having a given field angle is placed on each lens of the multilens-array positioned at at least the end of each of the multilens units so as to regulate the quantity of rays of light incident upon said lens, thereby preventing the resulting intermediate image from overlapping with the adjacent intermediate images formed by the adjacent lenses thereto.

8. A method for varying magnifications of an optical system comprising multilens units of a variety of variable magnifications, each of which has a plurality of arrays of lenses positioned in spaced vertical relationship, said multilens units being disposed in such a manner an optical unit plane containing optical axes of the lenses in each of the arrays of lenses in one multilens unit intersects other optical unit planes at the center line of each of the optical unit planes, and each of said arrays of lenses having a plurality of identicial lenses arranged in one or more rows, each row comprising an optical unit plane which contains coplanar optical axes of the lenses in each row of said arrays of lenses in a multilens unit, and each of the optical axes of the lenses in a row of lenses of each of the multilens units is non-colinear with each of the corresponding lenses in the next positioned row of lenses within an optical unit plane, said method comprising rotating said optical system around the axis of the intersection line of the optical unit planes to a predetermined position.

9. A method according to claim 8 wherein a diaphragm limiting the field of view having a given field angle is placed on each lens of the multilens-array positioned at at least the end of each of the multilens units so as to regulate the quantity of rays of light incident upon said lens, thereby preventing the resulting intermediate image from overlapping with the adjacent intermediate images formed by the adjacent lenses thereof.

10. A method according to claim 8 or 9 wherein the distance between an object and the multilens-array at the end of each of the multilens units is equal to that between the final image and the multilens-array at the other end of each of the multilens units.

* * * * *